(12) United States Patent
Kordus, II et al.

(10) Patent No.: US 8,063,455 B2
(45) Date of Patent: Nov. 22, 2011

(54) MULTI-TERMINAL ELECTROMECHANICAL NANOCSOPIC SWITCHING DEVICE WITH CONTROL AND RELEASE ELECTRODES

(75) Inventors: Louis Charles Kordus, II, Redwood City, CA (US); Colin Neal Murphy, Belmont, CA (US); Malcolm John Wing, Palo Alto, CA (US)

(73) Assignee: Agate Logic, Inc., Cupertino, CA (US)

( * ) Notice: Subject to any disclaimer, the term of this patent is extended or adjusted under 35 U.S.C. 154(b) by 769 days.

(21) Appl. No.: 11/285,595

(22) Filed: Nov. 22, 2005

(65) Prior Publication Data

US 2007/0114679 A1   May 24, 2007

(51) Int. Cl.
*H01L 51/10* (2006.01)
*H01L 49/02* (2006.01)

(52) U.S. Cl. ............ 257/415; 257/E51.04; 977/938; 977/940; 977/943

(58) Field of Classification Search .......... 257/1, 5, 257/202, 203, 204, 208, 209, 414, 415, 416, 257/417, 418, 419, 420, E29.069, E29.07, 257/E29.071, E51.001, E51.023, E51.038, 257/E51.039, E51.04; 365/129, 151, 154, 365/163, 244; 977/902, 936, 937, 938, 939, 977/940, 943
See application file for complete search history.

(56) References Cited

U.S. PATENT DOCUMENTS

| | | | |
|---|---|---|---|
| 6,531,891 B1 | 3/2003 | Sun et al. | |
| 6,574,130 B2 | 6/2003 | Segal et al. | |
| 6,784,028 B2* | 8/2004 | Rueckes et al. | 438/128 |
| 2005/0036365 A1* | 2/2005 | Bertin et al. | 365/163 |

OTHER PUBLICATIONS

Rueckes, Carbon Nanotube-Based Nonvolatile Random Acces Memory for Molecular Computing, Science Jul. 7, 2000, vol. 289, pp. 94-97.

* cited by examiner

*Primary Examiner* — Samuel Gebremariam
*Assistant Examiner* — Andrew O. Arena
(74) *Attorney, Agent, or Firm* — Peter Su; SNR Denton US LLP

(57) ABSTRACT

A multi-terminal electromechanical nanoscopic switching device which may be used as a memory device, a pass gate, a transmission gate, or a multiplexer, among other things.

22 Claims, 5 Drawing Sheets

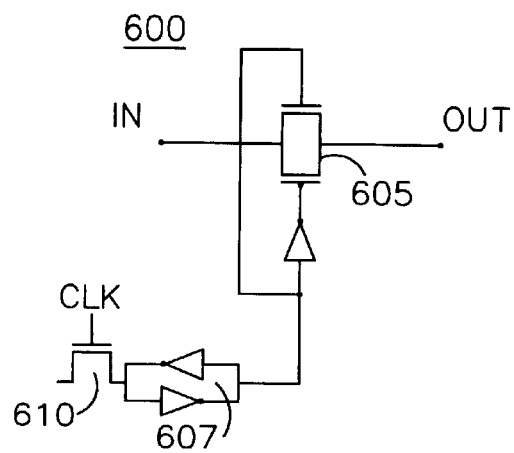
Fig. 6
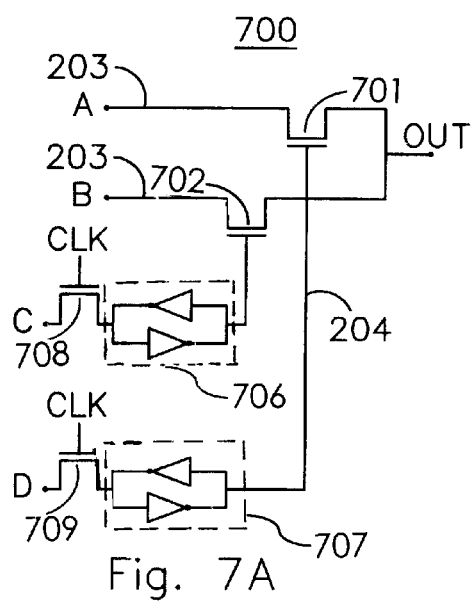 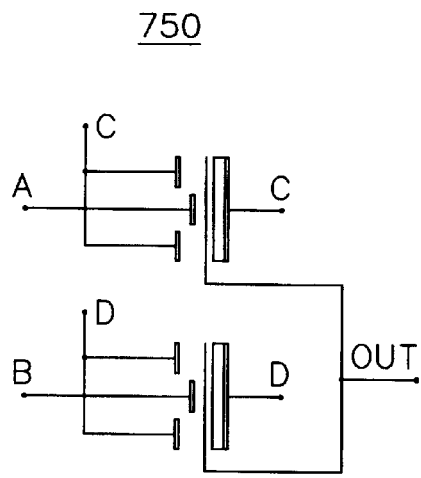
Fig. 7A  Fig. 7B

MULTI-TERMINAL ELECTROMECHANICAL NANOCSOPIC SWITCHING DEVICE WITH CONTROL AND RELEASE ELECTRODES

BACKGROUND OF THE INVENTION

1. Field of the Invention

This invention relates to a hybrid switching device and, in particular, to a multi-terminal electromechanical and semiconductor device which may be used, among other things, as a memory element, pass gate, transmission gate, or multiplexer.

2. History Of The Prior Art

Building computers and other electronic devices at the present state of the present art utilizes building blocks of complicated circuitry defined in metal/oxide/silicon (MOS) and linking the blocks together. The basic building blocks utilize components such as transistors, resistors, and capacitors. One of the important building blocks of circuitry is a memory element.

Important characteristics of memory structures are data retention, density, cost, power, and speed. There are a number of different types of memory structures which display differing characteristics making them suitable for different applications.

For example, read only memory (ROM) is relatively low cost but cannot be written. Programmable read only memory (PROM), electrically programmable read only memory (EPROM), and electrically erasable programmable read only memory (EEPROM) have read cycles that are fast relative to ROM and can be written; however, each has relatively long erase times and can be written reliably only over a only few iterative read/write cycles. Dynamic random access memory (DRAM) may be written and read rapidly but stores charge on capacitors which must be electrically refreshed by separate circuitry every few milliseconds to retain the memory contents. Static random access memory (SRAM) does not need to be refreshed and is fast relative to DRAM but more expensive. Both SRAM and DRAM are volatile in the sense that they do not retain stored data when power to the computer is removed.

Recently, the authors of "Carbon Nanotube-Based Nonvolatile Random Access Memory for Molecular Computing," Science, vol. 289, pp. 94-97, Jul. 7, 2000, proposed memory devices which use nanoscopic wires, such as single-walled carbon nanotubes, to form crossbar junctions to serve as memory cells. The article describes individual single-walled nanotube wires suspended over other wires to define memory cells. Electrical signals are written to one or both wires to generate electrostatic fields which causes the wires to physically attract one another. Each physical state, i.e. contact or no contact between the wires, corresponds to an electrical state. Wires that are not in contact form an open circuit junction, and wires in contact form a closed state form a rectified junction. When electric power is removed from the junction, the wires retain their physical (and thus electrical) state thereby forming a non-volatile memory cell. The carbon nanotube memory cell device described in the article is thus an electromechanical device.

U.S. Pat. No. 6,574,130, entitled "Hybrid Circuit Having Nanotube Electromechanical Memory," Segal et al, furnishes additional details including modifications for manufacturability of such memory devices.

As the patent discloses, it is possible to construct a hybrid electromechanical technology memory cell using semiconductor and carbon nanotube technology.

One especially useful building block used in electronic circuitry is the field programmable gate array. A field programmable gate array is programmable logic circuit typically implemented as an integrated circuit that includes a two-dimensional array of general-purpose logic circuits whose functions are programmable. For example, pass gates and transmission gates use transistors that act as switches to allow signals to pass from one node to another. Multiplexers allow the selection of one output from multiple inputs. These logic circuits are linked to one another by programmable buses. Memory cells can be used to program the interconnect buses to select among a variety of different functions that the logic circuits are able to perform. A field programmable gate array is described in U.S. Pat. No. 6,531,891.

These semiconductor logic structures are critical to the area density and power efficiency of modern electronic devices. Although these semiconductor circuits offer state of the art abilities, carbon nanotube technology appears to offer improved characteristics. For example, the hybrid memory cell has a symmetrical response to a given signal, is of small area. Moreover, these devices offer significant power efficiency and operating speed while requiring no additional circuitry to maintain their on or off states.

It would be desirable to provide a new hybrid electromechanical device which can be utilized to replace some of the memory and logic devices used in a field programmable gate array since. It would also be desirable to provide a hybrid electromechanical device which can be used as a number of different functional circuits by simply varying the signals controlling its operating parameters.

SUMMARY OF THE INVENTION

The present invention is realized by a multi-terminal electromechanical nanoscopic switching device which may be used as a memory device, a pass gate, a transmission gate, or a multiplexer, among other things.

In a first embodiment, an electromechanical switching device, comprises a flexible nanoscopic element suspended on a supporting base structure the flexible nanoscopic element capable of flexing between first and second positions in an open space over the supporting base structure; a first conductive terminal located at the first position in the space and overlying the supporting base structure, a top surface of the first conductive terminal and a bottom surface of the flexible nanoscopic element being separated by a gap when the flexible nanoscopic element is in the first position, the first conductive terminal disposed at a location that is underneath and proximate a midpoint of the flexible nanoscopic element; two second conductive terminals, the first conductive terminal disposed between and electrically isolated from the two second conductive terminals, the two second conductive terminals overlying the supporting base structure and located in the space out of range of the flexible nanoscopic element at a distance such that an applied electric field between the flexible nanoscopic element and the two second conductive terminals inducing the flexible nanoscopic element to be in direct contact with the top surface of the first conductive terminal thereby placing the flexible nanoscopic element in the second position; and a third conductive terminal vertically separated from the flexible nanoscopic element such that an applied electric field between the flexible nanoscopic element and the third conductive terminal inducing the flexible nanoscopic element to move to the first position.

In a second embodiment, a field programmable logic circuit, comprises an electromechanical switching device comprising a flexible nanoscopic element suspended on a supporting base structure, the flexible nanoscopic element capable of flexing between an open position and a closed position in an open space above the supporting base structure; a first conductive terminal overlying the supporting base structure, a top surface of the first conductive terminal and a bottom surface of the flexible nanoscopic element being separated by a gap when the flexible nanoscopic element is in the open position, the first conductive terminal disposed at a location that is underneath and proximate a midpoint of the flexible nanoscopic element; two second conductive terminals, the first conductive terminal disposed between and electrically isolated from the two conductive terminals, the two second conductive terminals overlying the supporting base structure and located in the space out of range of the flexible nanoscopic element at a distance such that an applied electric field between the flexible nanoscopic element and the two second conductive terminals inducing the flexible nanoscopic element to be in direct contact with the top surface of the first conductive terminal thereby placing the flexible nanoscopic element in the closed position; and a third conductive terminal vertically separated from the flexible nanoscopic element such that an applied electric field between the flexible nanoscopic element and the third conductive terminal inducing the flexible nanoscopic element to move to the open position, the third conductive terminal positioned to extend laterally to overlap with the first and second conductive terminals.

These and other objects and features of the invention will be better understood by reference to the detailed description which follows taken together with the drawings in which like elements are referred to by like designations throughout the several views. It is to be understood that, in some instances, various aspects of the invention may be shown exaggerated or enlarged to facilitate an understanding of the invention, and in other instances, some aspects of the invention considered to be conventional may not be shown so as to avoid obfuscating more important aspects or features of the invention.

BRIEF DESCRIPTION OF THE DRAWINGS

FIG. 6 illustrates a schematic circuit diagram of a prior art transmission gate and memory device;

FIG. 7A illustrates a schematic circuit diagram of a prior art multiplexer;

FIG. 7B illustrates a schematic circuit diagram of a hybrid electromechanical device representation which may be used as a replacement for the multiplexer;

DETAILED DESCRIPTION

Figure 1B:
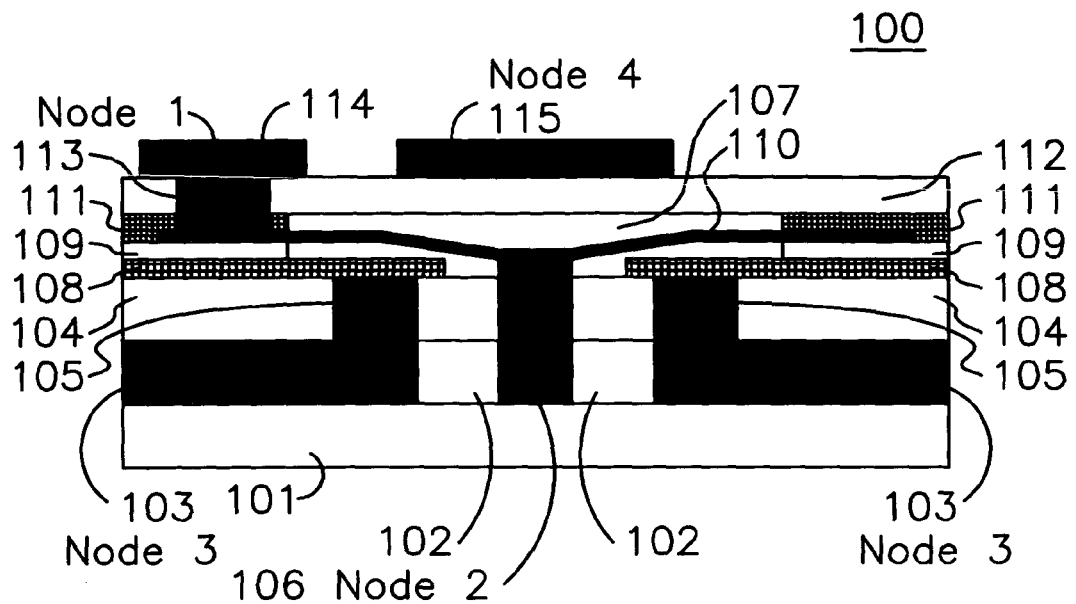
FIG. 1B illustrates an embodiment of a four terminal electromechanical device which is in the CLOSED or conducting condition.
Figure 1A:
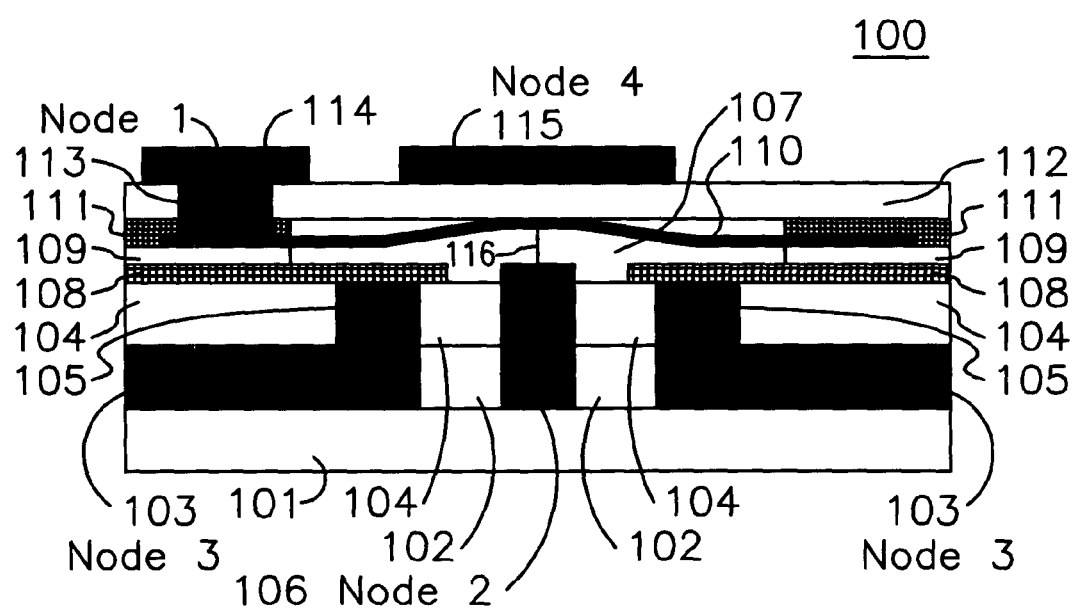
FIG. 1A illustrates an embodiment of a four terminal electromechanical device in accordance with the invention which is in the OPEN or non-conducting condition.

FIGS. 1A and 1B are idealized side views of a hybrid device 100 constructed in accordance with the present invention. The device 100 is fabricated in a manner such as that described in the above-mentioned patent using typical semiconductor deposition and etching techniques along with those techniques specific to the construction of nanoscopic devices. The particulars of such manufacture are well known to those skilled in the art having been described at length in any number of published works including the above-mentioned patent.

The preferred embodiment of this device is built on a base layer of semiconductor material 101, fabricated by covering a silicon substrate with silicon dioxide and an etch stop layer of silicon nitrate (SiN). A second layer 102 of inter-layer dielectric, a dielectric material such as fluorinated silicon glass, is deposited on the base layer 101. This second layer includes conductors 103, such as copper, which may be metal deposited in channels etched into the second layer 102 or otherwise provided in a manner known to those skilled the art. The second layer 102 and its included conductors 103 are covered by a third layer of inter-layer dielectric material 104.

Projecting through the second layer 102 and the third layer 104 are a pair of identical conductors 105 which may be placed in the manner in which vias are constructed in a typical process for preparing semiconductor circuits. For example, channels for the conductors 105 may be defined photographically and etched (using conventional single-Damascene process) through the layers 102 and 104; then copper may be electro-chemically deposited to form the conductors 105. These conductors contact the conductors 103 deposited in the second layer and project to the surface of the third layer 104.

A third conductor 106 which may be constructed in the same manner is placed between the two conductors 105 and projects through the layers 102 and 104 and into an open area 107 above layer 104. The bottom of the conductor 106 is electrically isolated from the conductors 105 but is connected to conductive material which may runs into the plane of the figure (as shown). Such a conductor might also project through the base layer 101 in a particular embodiment.

The two conductors 105 are covered by insulating material 108 such as silicon dioxide deposited over the third layer 104 before the deposition of the conductor 106. In manufacture, the material 108 and the layers 102 and 104 are patterned between the conductors 105 to provide a channel for deposit of the conductor 106. On top of the insulating material 108 is deposited another thin layer of dielectric material 109 such as SiN or $SiO_2$. The layer 109 is etched to remove a portion which would cover the conductors 105 and 106 leaving an open area 107. The layer 109 which remains supports the outer ends of a carbon nanotube layer 110. This carbon nanotube layer 110 may be any of individual nanoscopic wires, a ribbon made of matted layers of nanotubes, a non-woven fabric of nanotubes, or other nanoscopic element having similar electrical and mechanical properties. The ends of the carbon nanotube layer 110 are covered by conductive material 111 deposited thereon. A final layer of dielectric material 112 is deposited on top of the conductive material 111 to close the open space 107. Another metallic conductor 113 is formed in the manner of a via through the layer 112 to contact the conductor 111. Finally, a surface contact 114 and an electrode 115 of conductive material are deposited on the upper surface of the layer 112.

FIG. 1A illustrates the electromechanical device 100 of the present invention in the switch OPEN condition. The device 100 offers four externally-available terminals to which electrical values may be applied and thus may be referred to as a four terminal device.

The first of these terminals provides a conductive path from the contact 114 through the conductor 113 to the flexible conductive nanoscopic element of layer 110. At certain times in this discussion, this conductive path is referred to as Node 1. In one embodiment of the invention, the layer 110 may be a single carbon nanotube, a layer of nanotube mesh, a layer of densely-packed carbon nanotubes, or some similar flexible conductive nanoscopic material. The layer 110 is suspended at its ends by the layers 109 and 111 in the open area 107 within the structure of the device 100. It should be noted that different forms of nanoscopic material may be suspended differently; for example, a nanoscopic mesh may be suspended at a plurality of points around its entire periphery.

As is well known, carbon nanotubes may deflected through the application of electrical potential differences which create electrostatic fields affecting the nanotubes. The metallic nanoscopic layer 110 is sufficiently flexible and the dimensions of the device 100 are such that the layer 110 may be deflected from its unstressed suspended position to positions at which it touches the conductor 106 or the layer 112 by electrostatic fields created by the application of potentials applied to the various terminals referred to above.

More particularly, the conductor 106 (sometimes referred to herein as Node 2) protrudes into the space 107 but is separated from the layer 110 by a gap 116 in the OPEN condition of the device 100 shown in FIG. 1A. However, the conductor 106 lies at a position to make contact with the layer 110 when the layer 110 is flexed downward by the application of an electrostatic field. In this closed condition illustrated in FIG. 1B, a low resistance electrical signal path exists from the conductor 114 through the nanoscopic layer 110 to the conductor 106.

An electric field which causes the deflection of the layer 110 from the OPEN position shown in FIG. 1A to the CLOSED position shown in FIG. 1B is generated by the application of a potential difference between the layer 110 (Node 1) and the conductors 105 (sometimes referred to collectively as Node 3). The conductors 105 are conductive, electrically isolated from Node 1 by both positioning and the oxide layers 108, and connect by conductors 103 to an external source of potential (not shown). When a sufficient potential difference is applied between the layer 110 and the conductors 105, the layer 110 is drawn into contact with the conductor 106 to establish the signal path. Once it has been drawn into the closed position, the layer 110 remains in that position when the potentials creating the electrostatic field are removed because of the action of van der Waals forces between the nanoscopic layer and the conductor 106. Thus, this CLOSED condition is a non-volatile condition which may (according to one convention) be used to represent a logic state of ZERO.

The device 100 can be switched from the CLOSED condition shown in FIG. 1B back to the OPEN condition by the application of additional electrical potentials. More particularly, if a sufficient electrical potential difference is applied between the nanoscopic layer 110 and the conductor 115 (sometimes referred to as Node 4 herein) to generate an electric field sufficient to overcome the van der Waals forces holding the layer 110 in contact with the conductor 106, the layer 110 may be moved back into the OPEN position shown in FIG. 1A. In this position, a gap 116 exists so that the electrical signal path provided in the CLOSED condition of the device 100 no longer exists. This OPEN condition may be used to represent a logic state of ONE.

In the embodiment of the device 100 illustrated in FIGS. 1A and 1B, the oxide layer 112 separates Node 4 from the extreme upward position to which the layer 110 may flex. Thus, no contact exists between Nodes 1 and 4 and no electrical signal path is created. However, in other embodiments of the invention, no isolating layer 112 may exist so that contact may be established between these Nodes. A connection between the Nodes 1 and 4 may be useful to detect when an OPEN state has been achieved as a means of determining when the potential between the Nodes 1 and 4 may be removed, to detect faults in the device as when the OPEN state has not been achieved, and to increase the uses for the device.

In order to close the connection between Node 1 and Node 2 in a one embodiment, Node 4 is biased to the same voltage as Node 2. Voltage V is then applied to Node 1. Voltage V+Vp, where Vp is the programming voltage or the voltage required to create an electrostatic force great enough to overcome the inherent tension of the carbon nanotube film and any other attractive forces to deflect the film of Node 1 so that it contacts Node 2, is then applied to Node 3. The bias is then removed from the device after the film has contacted Node 2 and the connection has reached its lowest resistance state. The nanotube layer will remain in contact with Node 2 through the action of van der Waals forces between the nanotube layer and Node 2.

In order to open the connection between Node 1 and Node 2 in this embodiment, Node 3 is biased to a voltage between the highest and lowest voltages Nodes 1 and 2 assume in normal, non-conducting operation. Node 1 is biased to voltage V. Node 4 is biased to voltage V+Vr, where Vr is the voltage necessary to create a large enough voltage difference between Node 1 and Node 4 to overcome the van der Waals forces between the carbon nanotube layer of Node 1 and Node 2. This will cause the film to release from Node 2 and deflect in the direction of Node 4.

Figure 8:
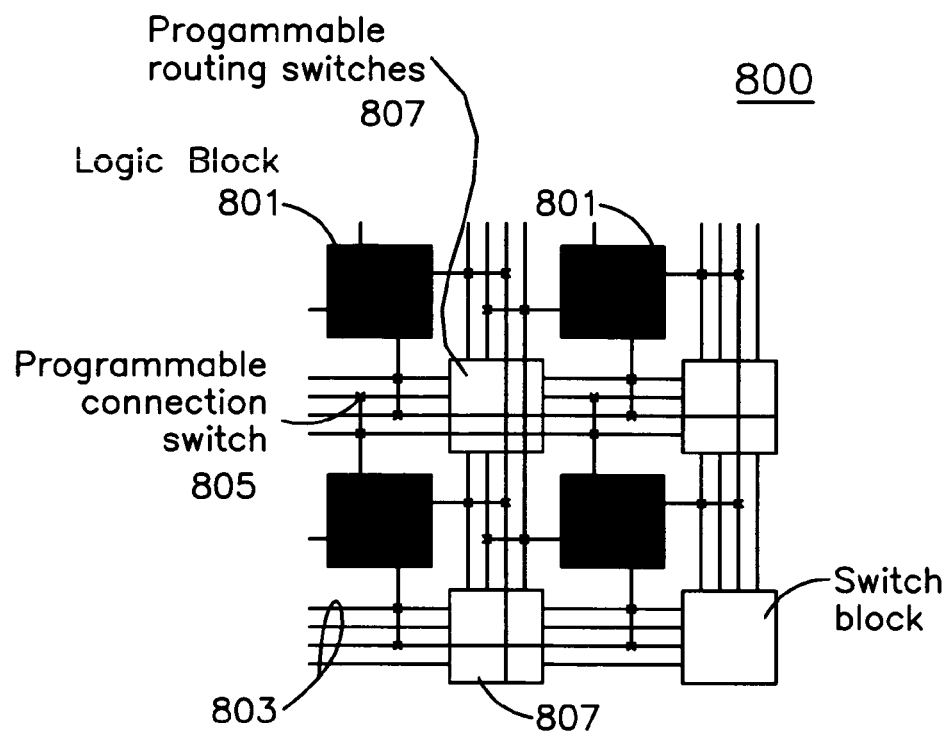
FIG. 8 is a block diagram illustrating a field programmable gate array.
Figure 9:
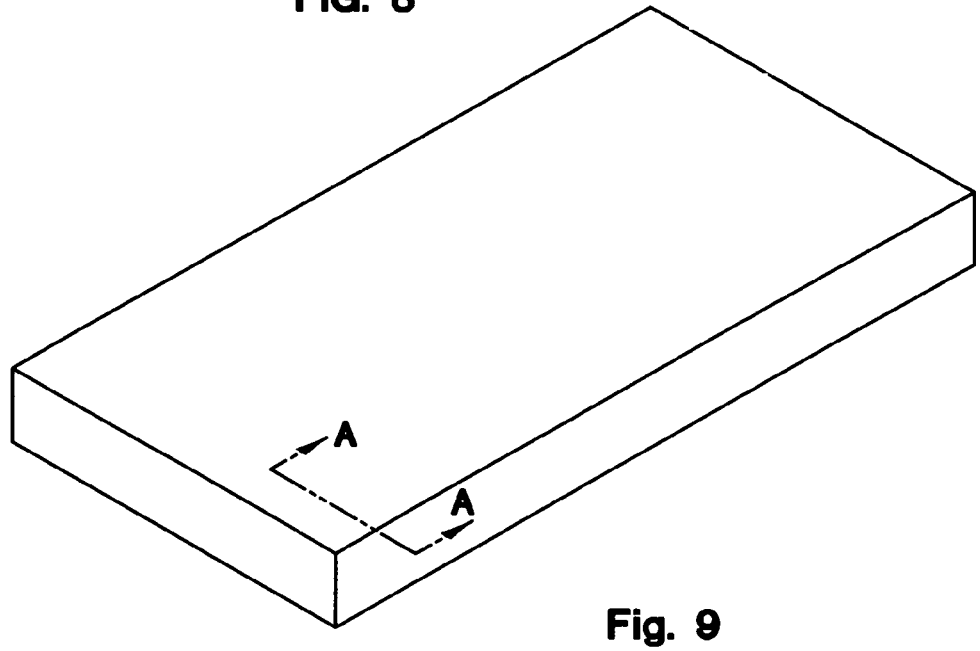
FIG. 9 is a perspective view of a semiconductor-based chip including a field programmable gate array utilizing a four terminal electromechanical device as illustrated in FIGS. 1A and 1B.

As mentioned above, it is desirable to utilize the device of the present invention as an element in a field programmable gate array in order to make use of its desirable characteristics. FIG. 8 is a block diagram illustrating a simple field programmable gate array 800. The array includes a number of logic blocks 801 each of which includes circuitry for performing various logic operations. In the array 800, the logic blocks are surrounded by a plurality of buses 803 having conductors to which the logic blocks may be selectively connected by programmable switches 805. In addition, the conductors of the buses 803 may be variously interconnected by programmable routing switches 807. Such an arrangement allows the programmable selection from among a variety of different functions that the logic circuits are able to perform.

The foregoing discussion demonstrates how the device can be used to provide a memory cell which can be used to program the interconnect buses to select among the variety of functions that a field programmable gate array is able to perform. The device is especially useful for this purpose because of its ability to function as a non-volatile memory cell thereby retaining its memory function even though power is removed from the gate array.

However, the device of the present invention offers a number of advantages over known prior art devices in that it is capable of being utilized as many different forms of logic devices and circuits simply by varying the signals controlling its operation. Thus, the device has the capability of functioning as a programmable element which may perform different logic functions depending on how it is controlled all while operating as a portion of a field programmable gate array. And the device functions, as will be seen, without the need for the significant amount of support circuitry necessary to maintain the operating functions of prior art logic circuits.

Figure 2:
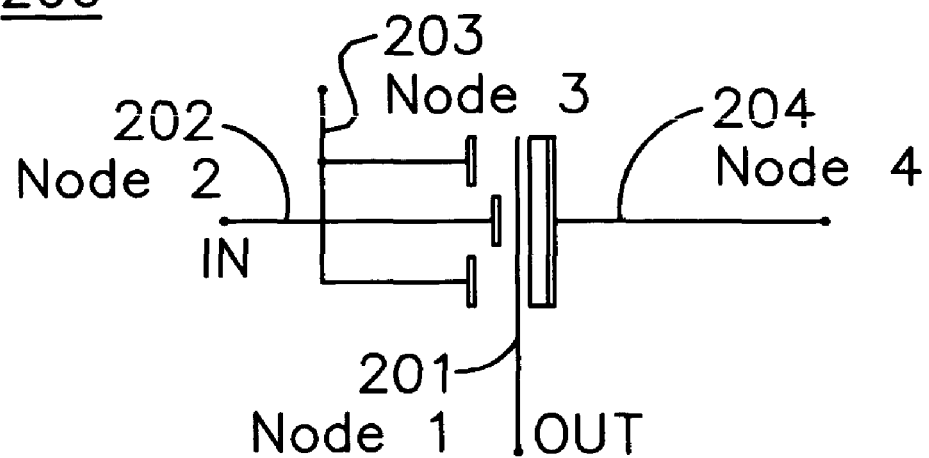
FIG. 2 illustrates a schematic circuit representation of the four terminal electromechanical device.

In order to demonstrate these additional capabilities, a schematic representation of the device of FIGS. 1A and 1B is useful. FIG. 2 is a schematic diagram of a device 200 used in the following description to represent the four terminal device 100 of FIGS. 1A and 1B. Element 201 represents the Node 1, including the nanoscopic film which may electrically connect to the element 202 (representing the Node 2) when a potential voltage is applied between the elements 203 (representing the Node 3) and the element 201. This potential difference creates an electrostatic field between Node 1 and Node 3 which pulls the element 201 into contact with the element 202. Because element 202 is not able to move, the element 201 will deflect towards the element 202 in the presence of this electrostatic field. If a sufficient potential difference is applied between Node 1 (element 201) and Node 3 (element 203), the nanoscopic film will deflect until it is in contact with Node 2 (element 202). When the potential difference between Node 1 and Node 3 is removed, the connection between Node 2 and the nanoscopic film of Node 1 will remain due to van der Waals forces between the two thus maintaining the electrical connection between the two nodes and allowing signals to pass from IN to OUT.

In order to release the carbon nanotube and OPEN the connection, a potential difference is applied between the element 201 and the element 204 (representing Node 4) in order to create an electrostatic field great enough to overcome the van der Waals forces between Node 2 and the nanoscopic layer of Node 1. This potential difference creates an electrostatic field which causes the film to release from Node 2 and deflect in the direction of Node 4 thus removing the electrical connection that allows signals to pass from Node 1 to Node 2. The schematic representation illustrated in FIG. 2 will be used in the discussion which follows to demonstrate how the device of this invention can be used as various forms of a pass gate, various forms of a transmission gate, or as a multiplexer, among other things.

Figure 3:
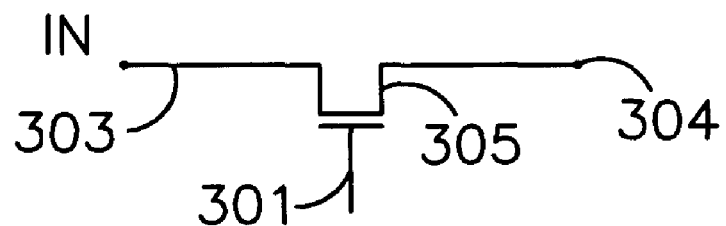
FIG. 3 illustrates a schematic circuit diagram of a prior art pass gate.

FIG. 3 is a schematic diagram of a prior art pass gate 300. Pass gates allow a signal to pass from one node to another under control of a particular input signal. Pass gates are typically made of one N-channel metal/oxide/silicon (MOS) transistor in order to save area. In order for a signal to pass from an IN terminal 303 to an OUT terminal 304, the NMOS transistor 305 must receive a positive signal, referred to as the gating control signal, at its gate terminal. The positive gate signal creates a closed junction between the source and drain terminals of the transistor 305 thus creating an electrical connection between IN and OUT. In a simple pass gate such as that illustrated in FIG. 3 provides an asymmetrical response in that a high valued incoming signal will be reduced by the threshold voltage of the n-channel enhancement device, while low valued signals do not have an associated threshold drop.

It may be seen that the four-terminal device 200 of FIG. 2 may be used as a replacement for the pass gate 300. The four-terminal device 200 receives gating signals that will either place the device into the CLOSED or OPEN position by shifting the nanoscopic film of element 201. If the nanoscopic film is in the CLOSED position (i.e., terminal 201 and terminal 202 are electrically connected by the nanoscopic film of element 201), a signal may pass from IN to OUT. If the device is in the OPEN position, the signal will not pass from IN to OUT. The gating signals provided are those described above furnished to the terminals 201, 202, and 204 to move the nanoscopic film between the OPEN and CLOSED positions. Unlike the pass gate, however, a constant gating pulse is not required to keep the electrical connection between IN and OUT. Node 1 and Node 2 will stay electrically connected via van der Waals forces between them until a potential voltage is applied to deflect the nanoscopic film of element 201 away from Node 2.

Figure 4:
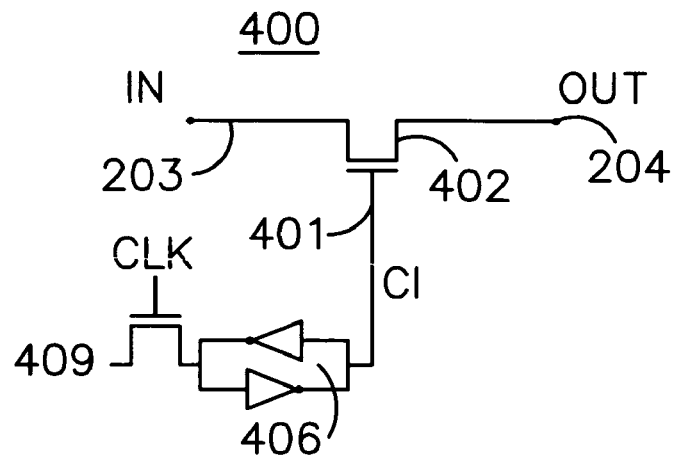
FIG. 4 illustrates a schematic circuit diagram of a prior art pass gate and memory device.

FIG. 4 illustrates a schematic diagram 400 of a prior art pass gate with a latching memory element. In this device 400, a clocked PMOS device 409 and a latch arrangement 406 control the gating control signal that is conveyed to the gate terminal 401 of a NMOS pass gate transistor 402. When a positive gating pulse reaches the element 401, a signal may pass from IN to OUT.

The clock enables the device 409 allowing the transfer of a gating pulse to the latch arrangement 406. The latch arrangement 406 acts as a memory element to maintain the signal applied to the gate terminal of the device 402. In this way, the latch 406 acts as a memory element thereby negating the need for a continuous gating signal. It should be noted that the latching arrangement 406 typically requires at least four separate MOS devices connected in a typical memory arrangement. Moreover, the memory function provided by the latch will not continue if the power is removed from the device 400.

It may be seen that the four-terminal device 200 of FIG. 2 may be used as a replacement for the pass gate and memory element 400. As explained with respect to the simple pass gate, the four-terminal device may be provided gating signals (furnished to the terminals 201, 202, and 204) that will either place the device into the CLOSED or OPEN position by shifting the nanoscopic film of element 201. If the nanoscopic film is in the CLOSED position (i.e., terminal 201 and terminal 202 are electrically connected by the nanoscopic film of element 201), a signal may pass from IN to OUT. If the device is in the OPEN position, the signal will not pass from IN to OUT. Unlike the pass gate, however, a constant gating pulse is not required to keep the electrical connection between IN and OUT. Terminal 201 and terminal 202 will stay electrically connected due to the van der Waals forces between them until a potential voltage is applied to deflect the nanoscopic film of element 201 away from terminal 202. Because the device in either the OPEN or the CLOSED position until new control signals are applied, there is no need for the latching device 406 which serves as a memory element in FIG. 4. Additionally, since the four-terminal device is non-volatile, it does not lose its setting when power is removed.

Figure 5:
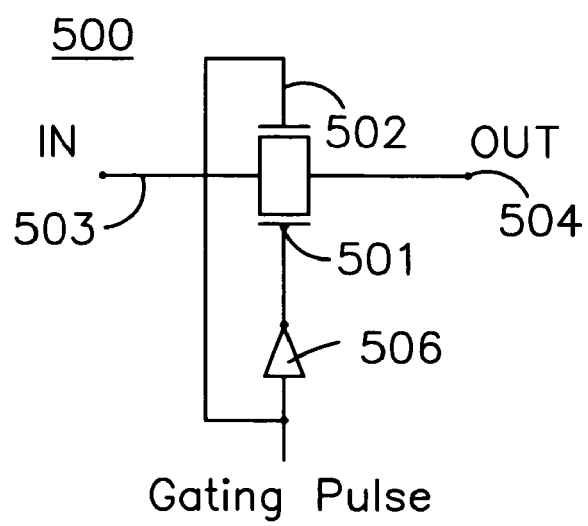
FIG. 5 illustrates a schematic circuit diagram of a prior art transmission gate.

FIG. 5 illustrates a schematic diagram of a typical prior art transmission gate 500. The transmission gate 505 uses both an NMOS type transistor 501 and a PMOS type transistor 502 to control the passage of a signal between IN terminal 503 and OUT terminal 504. When the device 500 receives a negative electrical gating pulse, the transmission gate will allow a signal to pass. A negative electrical gating pulse to the transmission gate 505 is furnished directly to the gate terminal of the device 502 and is inverted by an inverter 506 and furnished as a positive gating pulse to the gate terminal of the NMOS transistor 501. Thus, a gating pulse causes both transistors to activate so that the transmission gate will allow a signal to pass between IN and OUT terminals. If the transmission gate receives a positive gating pulse, neither transistor is activated; therefore no signal will pass between the IN and OUT terminals.

By using both an NMOS and a PMOS transistor, the transmission gate removes the asymmetrical response produced by the pass gate. However, a transmission gate has the added disadvantages of larger size and greater current leakage.

It will be apparent that the four-terminal device 200 shown in FIG. 2 may be used as a replacement for the transmission gate 500. As explained with respect to the simple pass gate, the four-terminal device may be provided gating signals (furnished to the terminals 201, 202, and 204) that will either place the device into the CLOSED or OPEN position by shifting the nanoscopic film of element 201. If the nanoscopic film is in the CLOSED position (i.e., terminal 201 and terminal 202 are electrically connected by the nanoscopic film of element 201), a signal may pass from IN to OUT. If the device is in the OPEN position, the signal will not pass from IN to OUT. Unlike the transmission gate, however, a constant gating pulse is not required to keep the electrical connection between IN and OUT. Terminal 201 and terminal 202 will stay electrically connected due to the van der Waals forces between them until a potential voltage is applied to deflect the nanoscopic film of element 201 away from terminal 202.

FIG. 6 illustrates a schematic diagram 600 of a prior art transmission gate 605 and memory element represented by a latching element 607. In this device a clock applied to gate a transistor device 610 and a latching arrangement 607 control the passage of the gating pulse that is conveyed to the transmission gate 605 in the same manner as explained above with respect to FIG. 4. When a negative gating pulse reaches the transmission gate, the signal being controlled may pass from the IN terminal to the OUT terminal, as described above. As with the circuit of FIG. 4, the latching arrangement acts as a memory element but will not remember the signal if the power is removed from the device.

The four-terminal device 200 of FIG. 2 may also be used as a replacement for the transmission gate plus memory element 600. As explained with respect to the simple pass gate, the four-terminal device may be provided gating signals (furnished to the terminals 201, 202, and 204) that will either place the device into the CLOSED or OPEN position by shifting the nanoscopic film of element 201. If the nanoscopic film is in the CLOSED position (i.e., terminal 201 and terminal 202 are electrically connected by the nanoscopic film of element 201), a signal may pass from IN to OUT. If the device is in the OPEN position, the signal will not pass from IN to OUT. Unlike the transmission gate of FIG. 6, however, a constant gating pulse is not required to keep the electrical connection between IN and OUT. Terminal 201 and terminal 202 will stay electrically connected due to the van der Waals forces between them until a potential voltage is applied to deflect the nanoscopic film of element 201 away from terminal 202. Because the terminals stay electrically connected, there is no need for the latching device 607 which serves as a memory element in the circuit of FIG. 6. Additionally, the four-terminal device is non-volatile, therefore it will not lose its setting when power is removed.

FIG. 7A illustrates a schematic circuit diagram of a prior art multiplexer 700. Multiplexers take a number of inputs and provide a single output. In the device shown, there are two pass gates 701 and 702 plus two memory elements 706 and 707. These two pass gates allow a signal to pass either from terminal A to OUT or from terminal B to OUT, depending on whether the gating pulse is delivered to the element 701 or the element 702.

Each of the pass gates with its memory element functions as does the pass gate illustrated in FIG. 3. The gating pulses are controlled by a clock provided to devices 708 and 709 and two latching circuit arrangements 706 and 707 the selected one of which delivers a continuous gating pulse to the selected pass gate 701 or 702. Depending on which pass gate is activated, the multiplexer will either allow a signal to pass between A and OUT or to pass between B and OUT.

FIG. 7B illustrates a schematic diagram of an arrangement 750 including two four-terminal devices which may be used as a replacement for a multiplexer. In the given embodiment, the two four-terminal devices each act as pass gates but have their outputs connected thus forming a multiplexer. In this multiplexer, either of the two inputs A or B may pass to the OUT terminal depending on which four-terminal device is in the CLOSED or OPEN state.

Although the present invention has been described in terms of a preferred embodiment, it will be appreciated that various modifications and alterations might be made by those skilled in the art without departing from the spirit and scope of the invention. For example, the four-terminal device may be designed to allow an electrical connection between Node 1 and Node 4 so that the device may be used for other purposes such as testing. Additionally, the device may be made with varying numbers of nodes.

The invention should therefore be measured in terms of the claims which follow.

What is claimed is:

1. An electromechanical switching device, comprising:
a flexible nanoscopic element suspended on a supporting base structure, the flexible nanoscopic element capable of flexing between first and second positions in an open space over the supporting base structure;
a first conductive terminal located at the first position in the space and overlying the supporting base structure, a top surface of the first conductive terminal and a bottom surface of the flexible nanoscopic element being separated by a gap when the flexible nanoscopic element is in the first position, the first conductive terminal disposed at a location that is underneath and proximate a midpoint of the flexible nanoscopic element;
two second conductive terminals, the first conductive terminal disposed between and electrically isolated from the two second conductive terminals, the two second conductive terminals overlying the supporting base structure and located in the space out of range of the flexible nanoscopic element at a distance such that an applied electric field between the flexible nanoscopic element and the two second conductive terminals inducing the flexible nanoscopic element to be in direct contact with the top surface of the first conductive terminal thereby placing the flexible nanoscopic element in the second position; and
a third conductive terminal vertically separated from the flexible nanoscopic element such that an applied electric field between the flexible nanoscopic element and the third conductive terminal inducing the flexible nanoscopic element to move to the first position.

2. The electromechanical switching device as recited in claim 1, wherein the second conductive terminal includes two individual terminals electrically joined together.

3. The electromechanical switching device as recited in claim 1, wherein the third conductive terminal is electrically isolated from the element.

4. The electromechanical switching device as recited in claim 1, wherein the flexible nanoscopic element is a nanoscopic wire.

5. The electromechanical switching device as recited in claim 1, wherein the flexible nanoscopic element is a nanoscopic ribbon.

6. The electromechanical switching device as recited in claim 1, wherein the flexible nanoscopic element is a non-woven fabric of nanotubes.

7. The electromechanical switching device as recited in claim 1, wherein the flexible nanoscopic element is suspended at opposite ends of its length.

8. The electromechanical switching device as recited in claim 1 implemented to function as a pass gate.

9. The electromechanical switching device as recited in claim 1 implemented to function as a transmission gate.

10. The electromechanical switching device as recited in claim 1, wherein two electromechanical switching devices are implemented to function as a multiplexer.

11. The electromechanical switching device as recited in claim 1 implemented to function as a memory array.

12. A field programmable logic circuit, comprising:
an electromechanical switching device comprising a flexible nanoscopic element suspended on a supporting base structure, the flexible nanoscopic element capable of flexing between an open position and a closed position in an open space above the supporting base structure;
a first conductive terminal overlying the supporting base structure, a top surface of the first conductive terminal and a bottom surface of the flexible nanoscopic element being separated by a gap when the flexible nanoscopic element is in the open position, the first conductive terminal disposed at a location that is underneath and proximate a midpoint of the flexible nanoscopic element;
two second conductive terminals, the first conductive terminal disposed between and electrically isolated from the two conductive terminals, the two second conductive terminals overlying the supporting base structure and located in the space out of range of the flexible nanoscopic element at a distance such that an applied electric field between the flexible nanoscopic element and the two second conductive terminals inducing the flexible nanoscopic element to be in direct contact with the top surface of the first conductive terminal thereby placing the flexible nanoscopic element in the closed position; and
a third conductive terminal vertically separated from the flexible nanoscopic element such that an applied electric field between the flexible nanoscopic element and the third conductive terminal inducing the flexible nanoscopic element to move to the open position.

13. The field programmable logic circuit as recited in claim 12, wherein the second conductive terminal includes two individual terminals electrically joined together.

14. The field programmable logic circuit as recited in claim 12, wherein the third conductive terminal is electrically isolated from the nanoscopic element.

15. The field programmable logic circuit as recited in claim 12, wherein the nanoscopic element is a nanoscopic wire.

16. The field programmable logic circuit as recited in claim 12, wherein the nanoscopic element is a nanoscopic ribbon.

17. The field programmable logic circuit as recited in claim 12, wherein the nanoscopic element is a non-woven fabric of nanotubes.

18. A field programmable logic circuit as recited in claim 12, wherein the electromechanical switching device is implemented to function as a pass gate.

19. A field programmable logic circuit as recited in claim 12, wherein the electromechanical switching device is implemented to function as a transmission gate.

20. A field programmable logic circuit as recited in claim 12, wherein two electromechanical switching devices are implemented to function as a multiplexer.

21. An electromechanical switching device, comprising:
a flexible nanoscopic element suspended on a supporting base structure, the flexible nanoscopic element capable of flexing between first and second positions in an open space over the supporting base structure;
a first conductive terminal located at the first position in the space and overlying the supporting base structure, a top surface of the first conductive terminal and a bottom surface of the flexible nanoscopic element being separated by a gap when the flexible nanoscopic element is in the first position, the first conductive terminal disposed at a location that is underneath and proximate a midpoint of the flexible nanoscopic element;
two second conductive terminals, the first conductive terminal disposed between and electrically isolated from the two second conductive terminals, the two second conductive terminals overlying the supporting base structure and located in the space out of range of the flexible nanoscopic element at a distance such that an applied electric field between the flexible nanoscopic element and the two second conductive terminals inducing the flexible nanoscopic element to be in contact with the top surface of the first conductive terminal thereby placing the flexible nanoscopic element in the second position; and
a third conductive terminal vertically separated from the flexible nanoscopic element such that an applied electric field between the flexible nanoscopic element and the third conductive terminal inducing the flexible nanoscopic element to move to the first position, the third conductive terminal positioned to extend laterally to overlap with the first and second conductive terminals.

22. A field programmable logic circuit, comprising:
an electromechanical switching device comprising a flexible nanoscopic element suspended on a supporting base structure, the flexible nanoscopic element capable of flexing between an open position and a closed position in an open space above the supporting base structure;
a first conductive terminal overlying the supporting base structure, a top surface of the first conductive terminal and a bottom surface of the flexible nanoscopic element being separated by a gap when the flexible nanoscopic element is in the open position, the first conductive terminal disposed at a location that is underneath and proximate a midpoint of the flexible nanoscopic element;
two second conductive terminals, the first conductive terminal disposed between and electrically isolated from the two conductive terminals, the two second conductive terminals overlying the supporting base structure and located in the space out of range of the flexible nanoscopic element at a distance such that an applied electric field between the flexible nanoscopic element and the two second conductive terminals inducing the flexible nanoscopic element to be in contact with the top surface of the first conductive terminal thereby placing the flexible nanoscopic element in the closed position; and
a third conductive terminal vertically separated from the flexible nanoscopic element such that an applied electric field between the flexible nanoscopic element and the third conductive terminal inducing the flexible nanoscopic element to move to the open position, the third conductive terminal positioned to extend laterally to overlap with the first and second conductive terminals.

* * * * *